United States Patent
Noh et al.

(10) Patent No.: US 7,573,058 B2
(45) Date of Patent: Aug. 11, 2009

(54) PHASE CHANGE MATERIALS, PHASE CHANGE RANDOM ACCESS MEMORIES HAVING THE SAME AND METHODS OF OPERATING PHASE CHANGE RANDOM ACCESS MEMORIES

(75) Inventors: Jin-seo Noh, Seoul (KR); Ki-joon Kim, Yongin-si (KR); Yoon-ho Khang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 11/509,001

(22) Filed: Aug. 24, 2006

(65) Prior Publication Data

US 2007/0170881 A1   Jul. 26, 2007

(30) Foreign Application Priority Data

Jan. 5, 2006   (KR) .................... 10-2006-0001392

(51) Int. Cl.
*H01L 29/02* (2006.01)
(52) U.S. Cl. ..................... 257/2; 257/3; 257/4; 257/5; 438/102; 438/103
(58) Field of Classification Search ................. 257/225, 257/1–5; 318/453; 365/96; 428/64.4; 438/102–103
See application file for complete search history.

(56) References Cited

U.S. PATENT DOCUMENTS

| 5,058,061 | A | * | 10/1991 | Koshino et al. | ............. | 365/106 |
| 5,254,382 | A | * | 10/1993 | Ueno et al. | ................ | 428/64.5 |
| 2001/0036528 | A1 | * | 11/2001 | Abiko et al. | ............... | 428/64.4 |
| 2004/0037106 | A1 | * | 2/2004 | Lu et al. | ...................... | 365/96 |
| 2005/0093043 | A1 | * | 5/2005 | Morita et al. | ............... | 257/295 |

FOREIGN PATENT DOCUMENTS

JP   1996-287515   11/1996

* cited by examiner

*Primary Examiner*—Thanh V Pham
*Assistant Examiner*—Jami M Valentine
(74) *Attorney, Agent, or Firm*—Harness, Dickey & Pierce

(57) ABSTRACT

A phase change memory device includes a switch and a storage node connected to the switch. The storage node includes a first electrode, a phase change layer and a second electrode. The phase change layer is formed of an InSbTe compound doped with Ge. In a method of operating a phase change memory including a switch and a storage node, the switch is maintained in an on state, and a first current is applied to the storage node.

4 Claims, 5 Drawing Sheets

US 7,573,058 B2

PHASE CHANGE MATERIALS, PHASE CHANGE RANDOM ACCESS MEMORIES HAVING THE SAME AND METHODS OF OPERATING PHASE CHANGE RANDOM ACCESS MEMORIES

PRIORITY STATEMENT

This application claims priority under 35 U.S.C. §119 to Korean Patent Application No. 10-2006-0001392, filed on Jan. 5, 2006, in the Korean Intellectual Property Office (KIPO), the entire contents of which is incorporated herein.

BACKGROUND

Description of the Related Art

In a related art phase change random access memory (PRAM), a phase change layer in which data is recorded enters a crystalline state or an amorphous state according to a thermal treatment. When the phase change layer is in a crystalline state, the resistance of the PRAM is lower (e.g., relatively low). When the phase change layer is in an amorphous state, the resistance of the PRAM is higher (e.g., relatively high). PRAM is a non-volatile memory that writes and/or reads data using the difference in resistance of the phase change layer when in a crystalline state and an amorphous state.

Related art PRAMs require a higher reset current to convert a phase change layer into an amorphous state. One example related art phase change material is GST ($Ge_2Sb_2Te_5$), which has a reset current of about 1.2 mA.

Integration of related art PRAMs may be increased by reducing the sizes of storage nodes and transistors including the phase change layers. However, reducing the size of a transistor may reduce the maximum current flow through a transistor.

SUMMARY

Example embodiments of the present invention relate to phase change materials for semiconductor memory devices, memory devices, such as, phase change random access memories (PRAMs) having the same, and methods of operating memory devices, such as, PRAMs.

At least example embodiment provides phase change materials changed to an amorphous state at a relatively lower temperature. At least one example embodiment provides a phase change memory device having a reduced reset current.

At least one example embodiment of the present invention provides methods of operating the phase change memory (PRAM).

According to at least one example embodiment of the present invention, phase change memory may include a switch and a storage node. The storage node may be connected to the switch, and may include a first electrode, a phase change layer and a second electrode. The phase change layer may be formed of an InSbTe compound doped with Ge. The amount of Ge in the phase change layer may be about 10 at % or less.

The InSbTe compound may include 20 to 50 at % of In, 10 to 20 at % of Sb, and 30 to 55 at % of Te. The phase change layer may include 4 to 9 at % of Ge, 21 to 48 at % of In, 16 to 19 at % of Sb, and 30 to 52 at % of Te. The phase change layer may include an $In_3Sb_1Te_2$ compound base having 4 to 6 at % of Ge.

According to at least one other example embodiment, a method of operating a phase change memory may include maintaining the switch in a turned on state, and supplying a first current to the storage node.

The first current may be one of a reset current, a set current and a reading current. After supplying the reset current to the storage node, a second current may be supplied to the storage node for a longer period than the first current.

When the first current is the reading current, the resistance of the storage node may be measured by supplying the reading current, and the measured resistance may be compared with a reference resistance.

According to at least one other example embodiment of the present invention, phase change memory may include a switch and a storage node. The storage node may be connected to the switch, and may include a first electrode, a phase change layer and a second electrode. The phase change layer may be formed of a chalcogenide compound doped with Ge.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
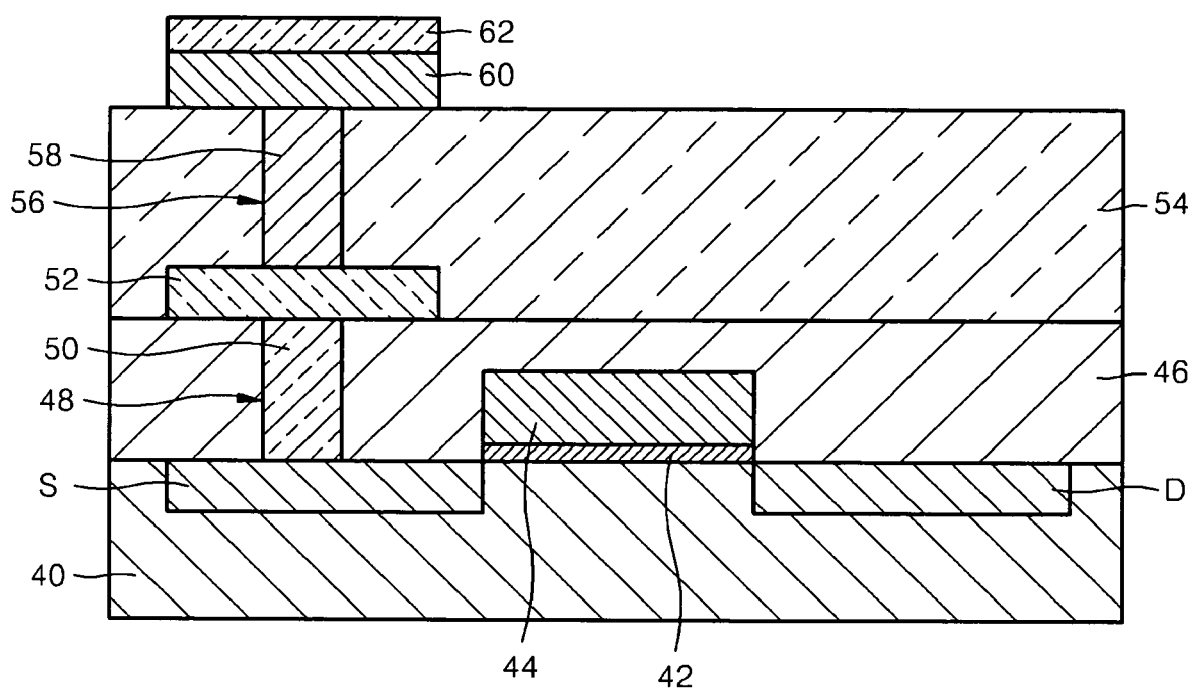
FIG. 1 is a cross-sectional view of a phase change random access memory (PRAM), according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

A phase change material, a phase change random access memory (PRAM) having the same and a method of operating the PRAM according to example embodiments will be described more fully with reference to the accompanying drawings. In the drawings, the sizes and thicknesses of layers and regions are exaggerated for clarity.

FIG. 1 is a cross-sectional view of a phase change random access memory (PRAM), according to an example embodiment of the present invention. Referring to FIG. 1, first and second impurity regions S and D doped with conductive impurities (e.g., n-type impurities) and may be separated by a distance in a substrate 40. The substrate 40 may be, for example, a silicon substrate doped with, for example, p-type impurities. The first impurity region S may be a source region and the second impurity region D may be a drain region. A gate oxide layer 42 may be formed on the substrate 40 between the first and second impurity regions S and D. A gate electrode or gate 44 may be formed on the gate oxide layer 42. The substrate 40, the first and second impurity regions S and D and the gate 44 may form a field effect transistor (FET). Alternatively, the transistor may be a PN junction diode.

A first interlayer insulation layer 46 may be formed on the substrate 40 and may cover the transistor. A first contact hole 48 may be formed within the first interlayer insulation layer 46 to expose the first impurity region S. Alternatively, the first contact hole 48 may expose the second impurity region D instead of the first impurity region S. The first contact hole 48 may be filled with a conductive plug 50. A lower electrode 52 covering an exposed upper surface of the conductive plug 50 may be formed on the first interlayer insulation layer 46. A second interlayer insulation layer 54 covering the lower electrode 52 may be formed on the first interlayer insulation layer 46. A second contact hole 56 may be formed in the second interlayer insulation layer 54 to expose an upper surface of the lower electrode 52. The first interlayer insulation layer 46 and the second interlayer insulation layer 54 may be formed of the same or substantially the same material. The second contact hole 56 may be filled with a lower electrode contact layer 58. A phase change layer 60 and an upper electrode 62 may be formed (e.g., sequentially formed) on the second interlayer insulation layer 54 to cover the lower electrode contact layer 58. The lower electrode 52, the lower electrode contact layer 58, the phase change layer 60 and the upper electrode 62 may form a storage node in which data (e.g., single-bit or multi-bit data) may be recorded.

The phase change layer 60 may be formed of an $In_xSb_yTe_z$ compound doped with Ge. x may be between about 20 to about 50 at %, inclusive, y may be between about 10 to about 20 at %, inclusive, and z may be about 30 to about 55 at %, inclusive. The phase change layer 60 may be doped with about 10 at % or less, for example, about 4 to about 9 at %, inclusive, of Ge.

The phase change layer 60 may be formed of about 4 to about 9 at %, inclusive, of Ge, about 21 to about 48 at %, inclusive of In, about 16 to about 19 at %, inclusive of Sb, and about 30 to about 52 at %, inclusive, of Te. In addition, in the phase change layer 60 an $In_3Sb_1Te_2$ compound base may include about 4 to about 6 at %, inclusive, of Ge.

The phase change layer 60 may be formed using a co-sputtering method using a $Ge_2Sb_2Te_5$ target and an In target or using a chemical vapor deposition (CVD) method.

Figure 2:
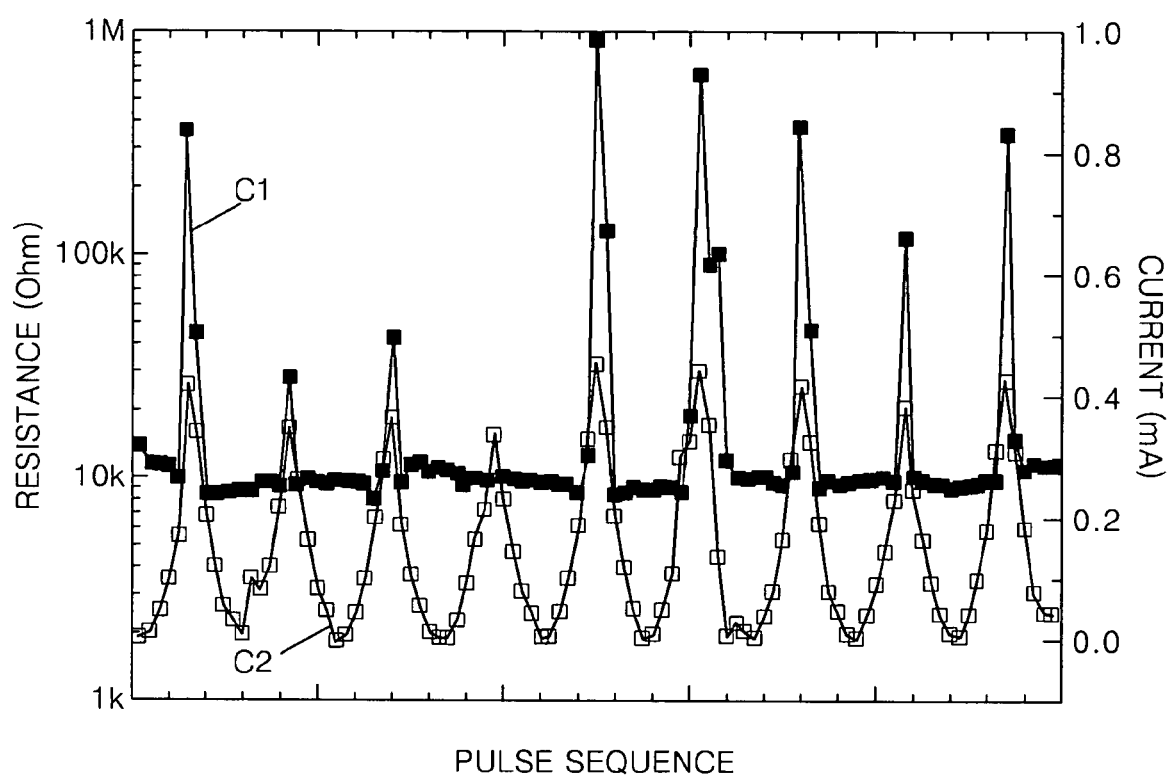
FIG. 2 is a graph of the resistance of a PRAM having a phase change layer formed of $Ge_{8.1}In_{23.6}Sb_{18.3}Te_{50.1}$ versus a current supplied to the PRAM, according to an example embodiment of the present invention.

FIG. 2 is a graph of resistance of a PRAM having a phase change layer formed of $Ge_{8.1}In_{23.6}Sb_{18.3}Te_{50.1}$ versus a current supplied to the PRAM, according to an example embodiment of the present invention. In FIG. 2, a first curve C1 denotes the current supplied to the PRAM, and a second curve C2 denotes the resistance of the PRAM measured after supplying the current.

Referring to FIG. 2, a current is repeatedly supplied according to a supply pattern, and thus, the resistance of the PRAM shows a repeating pattern. When the supplied current is about 0.4 mA, the resistance indicates that the phase change layer is amorphous. Accordingly, the reset current of the PRAM having the phase change material of the present embodiment is about 0.4 mA. This reset current is lower than the reset current of a related art PRAM including a GST material, which is about 1.2 mA.

Figure 3:
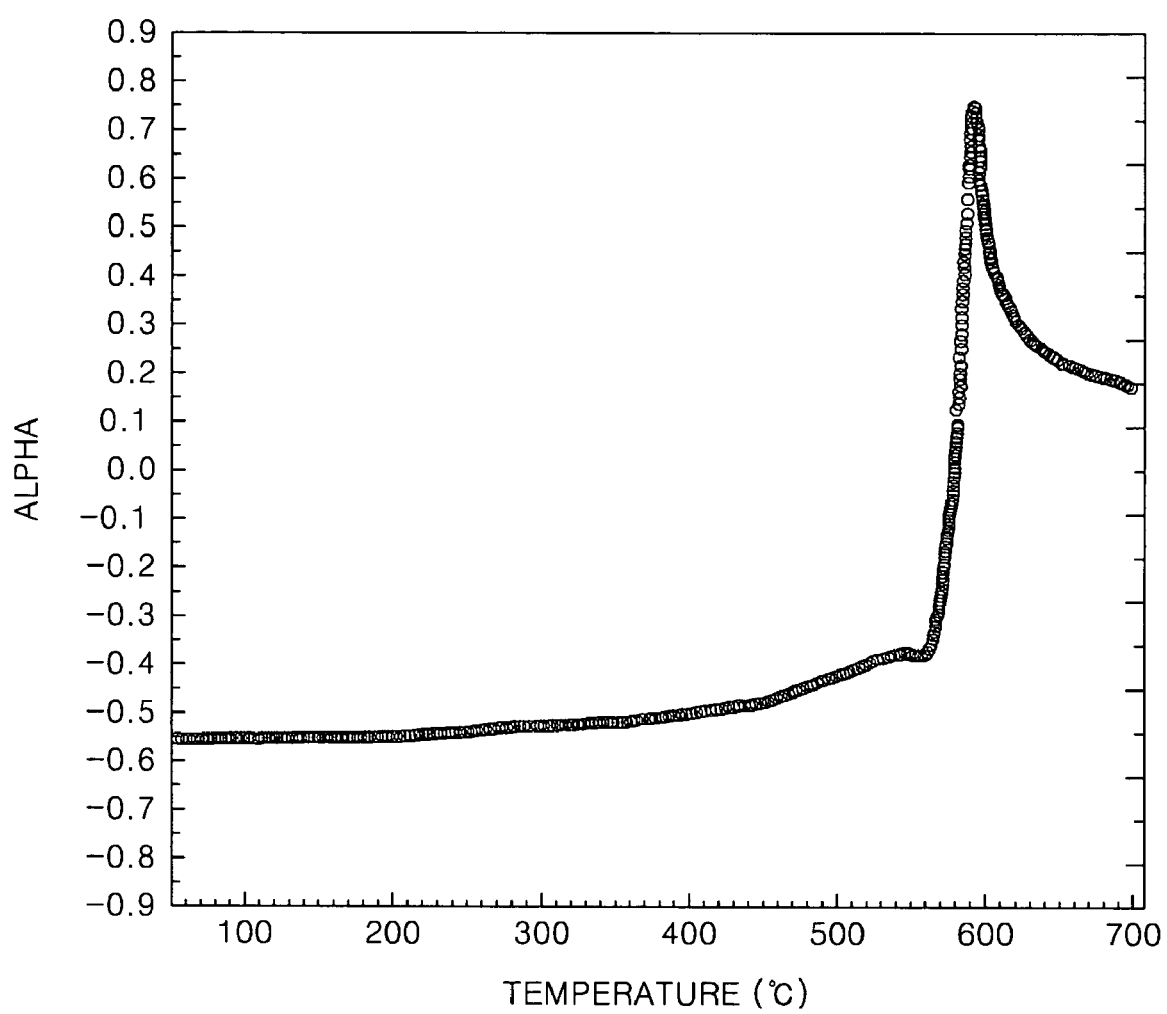
FIG. 3 is a graph illustrating the thermal behavior of a phase change layer in a PRAM, according to an example embodiment of the present invention.

FIG. 3 is a graph illustrating the thermal behavior of a phase change layer in a PRAM, according to an example embodiment of the present invention. In this example, the phase change material is a phase change material of $Ge_{8.1}In_{23.6}Sb_{18.3}Te_{50.1}$ deposited at 200° C.

Referring to FIG. 3, the phase change material becomes amorphous at about 570° C., which is lower than 620° C., the melting temperature of related art GST materials. Thus, the reset current of the PRAM having the phase change material of at least this example embodiment is lower than the reset current of a related art PRAM.

Figure 4:
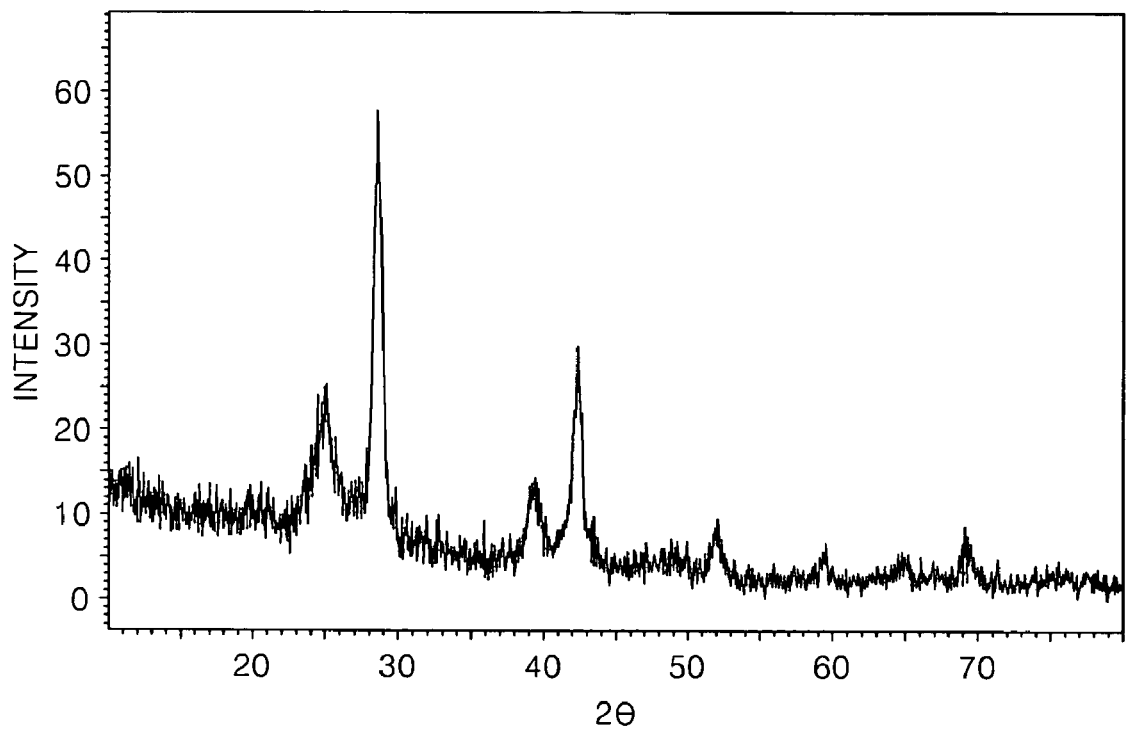
FIG. 4 is an X-ray diffraction pattern of a phase change layer formed of $Ge_{8.1}In_{23.6}Sb_{18.3}Te_{50.1}$ in a PRAM, according to an example embodiment of the present invention.

FIG. 4 is an X-ray diffraction pattern of a phase change layer formed of $Ge_{8.1}In_{23.6}Sb_{18.3}Te_{50.1}$ in a PRAM, according to an example embodiment of the present invention. Referring to FIG. 4, the phase change material ($Ge_{8.1}In_{23.6}Sb_{18.3}Te_{50.1}$) may be composed of a plurality of phases. When the phase change material is composed of a plurality of phases, the reaction to an external electric pulse is irregular so that the reset state of the PRAM having the phase change material is irregular.

Figure 5:
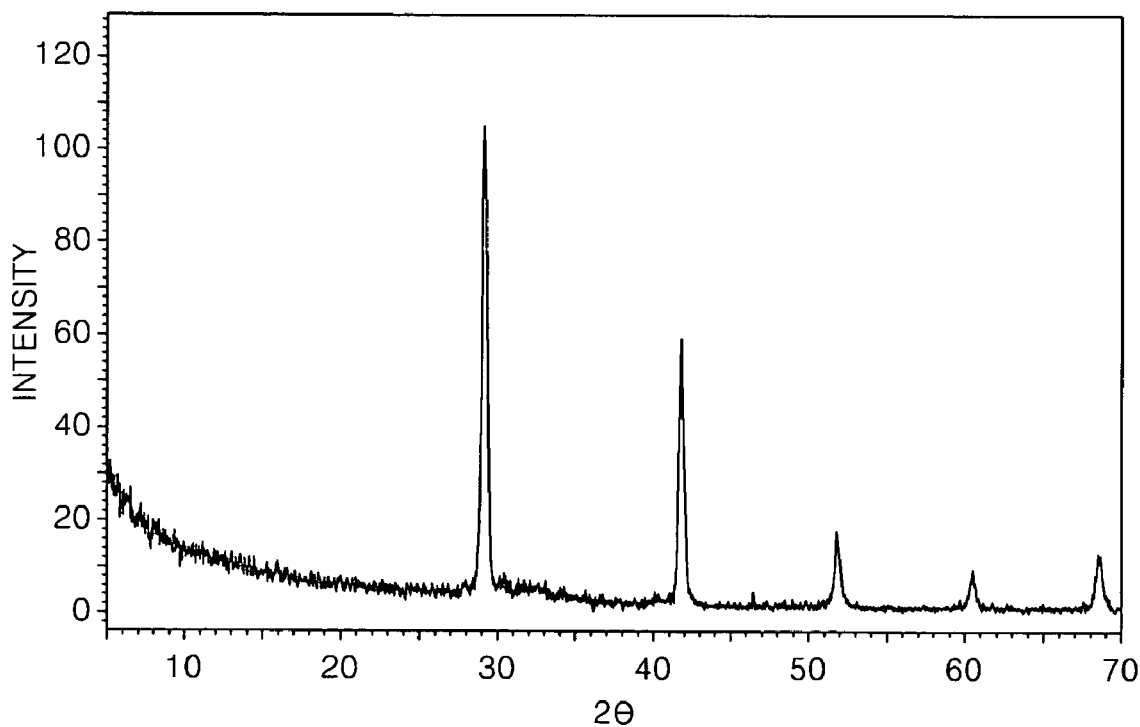
FIG. 5 is an X-ray diffraction pattern of a phase change layer formed of $Ge_5In_{45}Sb_{17}Te_{33}$ in a PRAM, according to another example embodiment of the present invention.

FIG. 5 is an X-ray diffraction pattern of a phase change layer formed of $Ge_5In_{45}Sb_{17}Te_{33}$ in a PRAM, according to another example embodiment of the present invention. Referring to FIG. 5, the $Ge_5In_{45}Sb_{17}Te_{33}$ may be formed by doping a small amount of Ge into $In_3Sb_1Te_2$. As a result, the peaks of the $Ge_5In_{45}Sb_{17}Te_{33}$ may be similar or substantially similar to the peaks of $In_3Sb_1Te_2$. The $Ge_5In_{45}Sb_{17}Te_{33}$ may have a single or a substantially single phase. The PRAM having this phase change material has a reset current and reset resistance similar or substantially similar to the related art.

Figure 6:
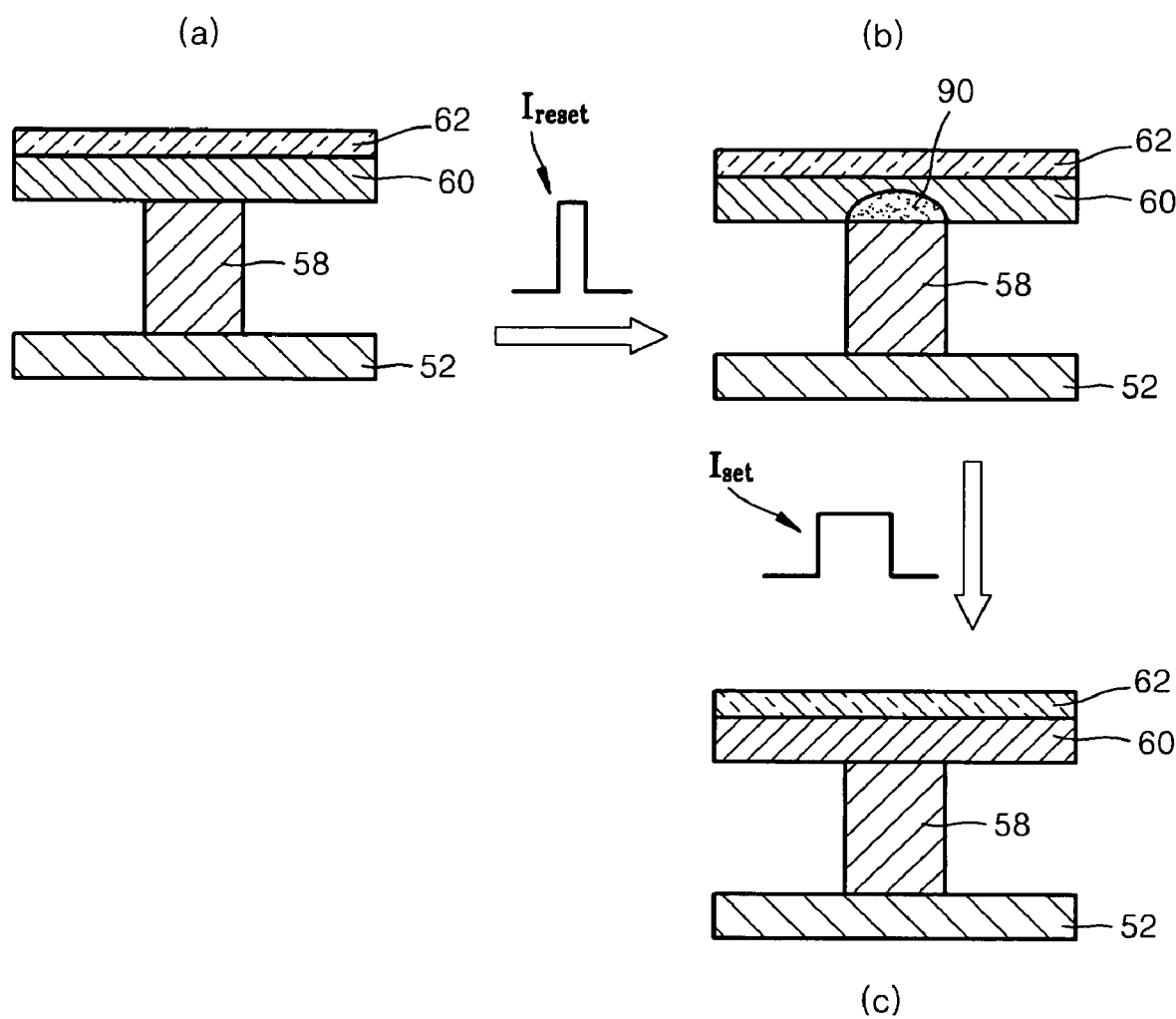
FIGS. 6A-6C illustrates a method of operating a PRAM, according to an example embodiment of the present invention.

When operating a PRAM, the transistor is turned on when the PRAM operates. For the sake of clarity, the switching element or switch has been omitted from FIG. 6. An example writing operation will now be described.

Referring to FIG. 6A, a current greater than a reset current $I_{reset}$ may be supplied to a phase change layer 60 in a crystalline state for a first time period. For example, the reset current $I_{reset}$ may be about 0.4 mA. The reset current $I_{reset}$ may heat a lower electrode contact layer 58, which may heat a portion of the phase change layer 60 contacting the lower electrode contact layer 58 above a phase change temperature. As a result, an amorphous region 90 may be formed in the phase change layer 60, as illustrated FIG. 6B. When the amorphous region 90 is formed in the phase change layer 60, the electric resistance of the phase change layer 60 may increase.

When the amorphous region 90 is formed in the phase change layer 60, data (e.g., bit data), for example, "1", may be recorded therein. When a portion of the phase change layer 60 is crystalline, data (e.g., bit data), for example, "0", may be recorded therein. The data corresponding to the states of the phase change layer 60 may be reversed.

Referring to FIG. 6B, when the amorphous region 90 exists in the phase change layer 60, a set current $I_{set}$ may be supplied to the phase change layer 60. The set current $I_{set}$ may be lower than the reset current $I_{reset}$ and supplied for a longer time period than the reset current $I_{reset}$.

When supplying the set current $I_{set}$, the amorphous region 90 in the phase change layer 60 may crystallize so all or substantially all of the phase change layer 60 may crystallize, as illustrated in FIG. 6C. The crystalline state of the phase change layer 60 in FIG. 6C may be the same or substantially the same as the crystalline state in FIG. 6A. Accordingly, the supply of the set current $I_{set}$ to the phase change layer 60 in FIG. 6B may be an erasing operation erasing bit data previously recoded in the phase change layer 60 or a writing operation writing bit data "0" in the phase change layer 60.

An example reading operation will now be described.

In an example reading operation, a current which does not induce a phase change in the phase change layer 60 may be supplied to both ends of the storage node including the phase change layer 60 to measure the resistance of the phase change layer 60. The measured resistance may be compared with a reference resistance and bit data recorded in the phase change layer 60 may be read as "1" or "0". The reading current supplied to the phase change layer 60 may be lower than the reset current $I_{reset}$ and the set current $I_{set}$.

As described above, a phase change layer, according to example embodiments, may enter an amorphous state at a lower current than in the related art, and the reset current of the PRAM of example embodiments may be lower than in the related art. When the reset current is lower, the size of a transistor may be reduced allowing integration of PRAMs to increase.

In example embodiments, the phase change material is described as indium-antimony-tellurium; However, similar chalcogenide compounds may be used. For example, arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase change chalcogenide compounds, the chalcogenide alloy of the phase change material could be selected from a binary phase change chalcogenide compound or a quaternary phase change chalcogenide compound. Example binary phase change chalcogenide compounds may include one or more of Ga—Sb, In—Sb, In—Se, $Sb_2$—$Te_3$ or Ge—Te compounds; example quaternary phase change chalcogenide compounds may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

The phase change material may be a chemical compound including one or more elements selected from the group consisting of S, Se, Te, As, Sb, Ge, Sn, In and Ag.

While example embodiments have been particularly shown and described with reference to the drawings, it will be understood by those of ordinary skill in the art that various changes in form and details may be made therein without departing from the spirit and scope of the present invention as defined by the following claims.

What is claimed is:

1. A phase change material comprising:
   an InSbTe compound doped with Ge, including about 21 at % to about 48 at %, inclusive of In, about 4 at % to about 9 at %, inclusive of Ge, about 16 at % to about 19 at %, inclusive of Sb, and about 30 at % to about 52 at %, inclusive of Te.

2. A phase change memory device comprising:
   a switch; and
   a storage node connected to the switch, the storage node including,
      a first electrode,
      a phase change layer including the phase change material of claim 1, and
      a second electrode.

3. A phase change material comprising:
   an $In_3Sb_1Te_2$ compound doped with Ge, including about 21 at % to about 48 at %, inclusive of In, and about 4 at % to about 6 at %, inclusive of Ge.

4. A phase change memory device comprising:
   a switch; and a storage node connected to the switch, the storage node including,
  a first electrode,
  a phase change layer including a phase change material, and
  a second electrode;

wherein the phase change material is an $In_3Sb_1Te_2$ compound doped with Ge, including about 21 at % to about 48 at %, inclusive of In, and about 4 at % to about 6 at %, inclusive of Ge.

* * * * *